(12) United States Patent
Hart et al.

(10) Patent No.: US 8,686,778 B2
(45) Date of Patent: Apr. 1, 2014

(54) INTEGRATED PULSE-CONTROL AND ENABLE LATCH CIRCUIT

(75) Inventors: Jason M. Hart, Hayden, ID (US); Robert P. Masleid, Sereno, CA (US)

(73) Assignee: Oracle America, Inc., Redwood Shores, CA (US)

( * ) Notice: Subject to any disclaimer, the term of this patent is extended or adjusted under 35 U.S.C. 154(b) by 165 days.

(21) Appl. No.: 12/546,529

(22) Filed: Aug. 24, 2009

(65) Prior Publication Data

US 2011/0043260 A1    Feb. 24, 2011

(51) Int. Cl.
*G01R 29/02* (2006.01)
*H03K 9/08* (2006.01)
*H03K 5/01* (2006.01)
*H03K 3/017* (2006.01)
*H03K 5/04* (2006.01)
*H03K 7/08* (2006.01)
*H03K 3/00* (2006.01)
*H03K 3/289* (2006.01)

(52) U.S. Cl.
USPC ............. 327/291; 327/36; 327/165; 327/166; 327/172; 327/175; 327/199; 327/203; 327/295; 327/298; 327/299

(58) Field of Classification Search
USPC ........... 327/36, 165, 166, 172–176, 199–203, 327/218, 295, 298, 299
See application file for complete search history.

(56) References Cited

U.S. PATENT DOCUMENTS

| 5,422,585 A * | 6/1995 | Fan Chiangi et al. ......... 327/170 |
| 7,389,403 B1 | 6/2008 | Alpert et al. |
| 2006/0274586 A1 * | 12/2006 | Takai et al. .................... 365/200 |
| 2007/0001727 A1 * | 1/2007 | Wielage ........................ 327/202 |

OTHER PUBLICATIONS

Masleid, Robert P. et al., U.S. Appl. No. 12/425,176, filed Apr. 16, 2009, Titled: "Economy Precision Generator".
Dixit, Anand et al., U.S. Appl. No. 12/495,088, filed Jun. 30, 2009, Titled: "Inverting Difference Oscillator".
Masleid, Robert P. et al., U.S. Appl. No. 12/494,663, filed Jun. 30, 2009, Titled: "Configurable Pulse Generator".
Alpert, Donald B. et al., U.S. Appl. No. 11/277,765, filed Mar. 29, 2006, Titled: "Thread Migration and Reconfiguration of a Multi-Core Processor".

* cited by examiner

*Primary Examiner* — Lincoln Donovan
*Assistant Examiner* — Colleen O Toole
(74) *Attorney, Agent, or Firm* — Park, Vaughan, Fleming & Dowler LLP

(57) ABSTRACT

The described embodiments provide a configurable clock circuit. The clock circuit includes a control and enable circuit and a clock distribution circuit. During operation, when a signal on an enable input to the control and enable circuit is asserted and the control and enable circuit is configured in a clock mode, the control and enable circuit generates an enable signal on a control output to enable a signal on a clock input to propagate through the clock distribution circuit to the clock output. Alternatively, when a signal on the enable input to the control and enable circuit is asserted and the control and enable circuit is configured in a pulse mode, the control and enable circuit generates a pulsed control signal on the control output to control a length of a pulse generated from the clock input on a clock output by the clock distribution circuit.

21 Claims, 10 Drawing Sheets

INTEGRATED PULSE-CONTROL AND ENABLE LATCH CIRCUIT

BACKGROUND

1. Field

The described embodiments relate to clock-control circuits. More specifically, the described embodiments relate to an integrated pulse-control and enable latch.

2. Related Art

Many integrated circuits use a clock signal for timing purposes. For example, integrated circuits can include flip-flops, latches, domino circuits, memories, or other types of circuits that are controlled or timed using a clock signal. In some integrated circuits, the clock signal is a pulsed signal. For example, some integrated circuits can include pulse latches, memory circuits such as synchronous random-access memories (SRAMs), or other circuits that are controlled or timed using pulsed signals.

Within an integrated circuit, clock signals are often distributed to large numbers of circuit elements. Consequently, many integrated circuits include dedicated circuits for distributing the clock signal. For example, FIG. 1 presents an exemplary clock header 100 used to distribute a clock signal in an integrated circuit. Clock header 100 takes clock input 102 and clock enable signal 104 as inputs and outputs clock output signal 106. When asserted (i.e., a logical "1"), clock enable signal 104 enables clock input 102 to propagate through clock header 100 to form clock output signal 106. Clock output signal 106 can then be used as a clock signal for other circuits (not shown).

For clock header 100, if clock enable signal 104 transitions at an incorrect time, it can corrupt clock output signal 106. More specifically, if an improperly timed rising or falling edge on clock enable signal 104 occurs during the high phase of clock input 102, it can cause the high phase of clock output signal 106 to be shorter than an expected duration. The corrupted high phase of clock output signal 106 can, in turn, cause serious errors in the circuits that use clock output signal 106 as a timing signal.

In order to avoid errors caused by mistimed transitions in the clock enable signal, some systems use a clock enable control to generate the clock enable signal. For example, FIG. 2 presents an exemplary clock enable control latch 200. Clock enable control latch 200 takes one or more enable signals (e.g., global power clock enable (GPCE) 202, power clock enable (PCE) 204, and power clock enable override (PCE_OV) 206) and a clock input 208 as inputs and outputs a clock enable signal 210. Within clock enable control latch 200, the latch that is formed by the back-to-back pair of the inverter that drives clock enable signal 210 and the tri-state inverter driven by clock enable signal 210 is transparent during the low phase of clock input 208, but becomes non-transparent and captures the value on the enable signals as clock input 208 rises, thereby setting the clock enable signal 210 at the captured value for the duration of the high phase of clock input 208.

FIG. 3 presents an exemplary clock generation circuit 300 that uses clock enable control latch 200 and clock header 100 to generate clock output signal 310. As can be seen in FIG. 3, clock enable control latch 200 provides a clock enable signal to the NAND gate in clock header 100. Because the clock enable signal generated by clock enable control latch 200 is prevented from transitioning during the high phase of clock input 308, clock generation circuit 300 can output clock output signal 310 without the above-described errors in clock output signal 310 caused by mistimed transitions in the enable signal.

Note that, in the configuration shown in FIG. 3, if the enable output of clock enable control latch 200 is asserted, clock input 308 is passed through clock generation circuit 300 to clock output signal 310 with no changes to the waveform of clock input 308 (i.e., clock output signal 310 has the same duty-cycle as clock input 308).

Unlike the circuit shown in FIG. 3, which can be used for integrated circuits that use a full duty-cycle clock signal, integrated circuits that use a pulsed clock can require an additional clock pulse control circuit that is used to control the length of the pulses in the clock signal. For example, FIG. 4 presents an exemplary clock pulse control circuit 400. Clock pulse control circuit 400 takes disable signal 404 and clock input 402 as inputs and outputs clock control output signal 406. If disable signal 404 is deasserted (i.e., a logical "0"), a falling edge on clock input 402 feeds through clock pulse control circuit 400 to cause a rising edge on clock control output signal 406. Clock control output signal 406 is then used to control a clock waveform that feeds back through a clock path (see, e.g., clock header 100 in FIG. 5) to form a rising edge on feedback signal 408, which pulls clock control output signal 406 low, ending the rising pulse on clock control output signal 406.

When coupled to the clock enable signal 104 input of a clock header 100, clock pulse control circuit 400 can control the pulse length in a pulsed clock. However, like the above-described clock circuits, glitches can occur on the clock signal output from clock header 100 if disable signal 404 is not prevented from switching at an incorrect time. A clock enable control latch 200 can be used to prevent the enable from switching incorrectly. However, clock enable control latch 200 provides an active-high (i.e., asserted) clock enable signal 210, while clock pulse control circuit 400 requires an active-low (i.e., deasserted) disable signal 404. Thus, if clock pulse control circuit 400 is to be used with clock enable control latch 200, either the enable signals must be inverted, or another modification must be made to clock enable control latch 200 to provide disable signal 404 in the correct logical state.

FIG. 5 presents an exemplary pulse clock generation circuit 500 that uses clock enable control latch 200, clock pulse control circuit 400, and clock header 100 to generate a pulsed clock output signal 502. As can be seen in FIG. 5, clock enable control latch 200 provides the disable signal to clock pulse control circuit 400 which, in turn, provides a control pulse to clock header 100. Clock circuit 500 therefore outputs a pulsed clock output signal 502 that is free from glitches caused by mistimed transitions in the enable signals. As described above, the enable signals (i.e., GPCE 506, PCE 508, and PCE_OV 510) to clock enable control latch 200 in this configuration must be logically inverted in comparison to the enable signals to clock enable control latch 200 in the configuration shown in FIG. 3.

Because pulse clock generation circuit 500 in the configuration shown in FIG. 5 requires the enable signals to clock enable control latch 200 to be logically inverted with respect to the enable signals used by clock enable control latch 200 as shown in the configuration in FIG. 3, a circuit designer who wishes to change a normal (i.e., full duty-cycle) clock to a pulsed clock by switching these circuits must also provide inverted enable signals and add a clock pulse control circuit 400. Hence, due to area constraints, timing constraints, and other considerations, swapping a full duty-cycle clock to a pulsed clock can be difficult. This can limit the designer's ability to replace full duty-cycle clocks with higher-performance pulsed clocks.

SUMMARY

The described embodiments provide a configurable clock control circuit (e.g., integrated pulse control and enable latch circuit 602 in FIG. 6). The described embodiments include: (1) a control and enable circuit having a clock input, a feedback input, and a control output, the clock input configured receive the clock signal; and (2) a clock distribution circuit coupled to the clock input configured to receive the clock signal and having an enable input and a clock output, the enable input coupled to the control output of the control and enable circuit. In these embodiments, when the feedback input is configured in a clock mode, the control and enable circuit generates a control signal on the control output to enable the clock signal to propagate through the clock distribution circuit to the clock output. Alternatively, when the feedback input is configured in a pulse mode, the control and enable circuit generates a control signal on the control output to control a length of a pulse responsive to the clock signal at the clock output of the clock distribution circuit.

In some embodiments, the feedback input is coupled to the clock output in the pulse mode and coupled to VSS in the clock mode.

In some embodiments, the control and enable circuit also includes a tri-state inverter having an input coupled to a non-inverted version of the clock input, an input coupled to an inverted version of the clock input, an input coupled to an internal enable node, and an output coupled to the control output. In these embodiments, the tri-state inverter is configured to propagate a signal on the internal enable node through the tri-state inverter to the control output when the clock signal is low, and to not propagate the signal on the internal enable node through the tri-state inverter when the clock signal is high.

In some embodiments, the tri-state inverter includes two p-type metal-oxide-semiconductor (PMOS) transistors coupled in series between VDD and the control output and two n-type metal-oxide-semiconductor (NMOS) transistors coupled in series between VSS and the control output. In these embodiments, a gate connection for both a first of the NMOS transistors and a first of the PMOS transistors is coupled to the internal enable node, a gate connection for a second of the PMOS transistors is coupled to the non-inverted version of the clock input, and a gate connection for a second of the NMOS transistors is coupled to the inverted version of the clock input.

In some embodiments, the control and enable circuit also includes a storage element coupled to the control output. In these embodiments, the storage element includes an interruptible tri-state inverter that includes: (1) an input coupled to the non-inverted version of the clock input, an input coupled to the inverted version of the clock input, an input coupled to an internal memory node, an input coupled to the feedback input, and an output coupled to the control output; and (2) an inverter that includes an input coupled to the control output and an output coupled to the internal memory node. In these embodiments, the interruptible tri-state inverter is configured to enable the storage element to capture a value on the control output when the clock signal transitions from low to high and store the value while the clock signal is high.

In some embodiments, the interruptible tri-state inverter includes three PMOS transistors coupled in series between VDD and the control output and two NMOS transistors coupled in series between VSS and the control output. In these embodiments, a gate connection for a first of the NMOS transistors is coupled to the non-inverted version of the clock input, a gate connection for a first of the PMOS transistors is coupled to the inverted version of the clock input, a gate connection for a second of the PMOS transistors is coupled to the feedback input, and a gate connection for a third of the PMOS transistors and a second of the NMOS transistors is coupled to the internal memory node.

In some embodiments, the control and enable circuit also includes an NMOS transistor coupled between the control output and VSS. In these embodiments, a gate connection of the NMOS transistor is coupled to the feedback input.

In some embodiments, the control and enable circuit includes at least one external enable input configured to receive at least one external enable signal. In these embodiments, the control and enable circuit includes a control stage having an inverting circuit element coupled between the at least one external enable input and the internal enable node configured to propagate the at least one external enable signal to the tri-state inverter.

In some embodiments, when a signal on the at least one external enable input is asserted, the control and enable circuit is configured to generate a signal on the control output to control the clock signal in the clock distribution circuit in the clock mode or in the pulse mode. In these embodiments, when a signal on the at least one external enable input is deasserted, the control and enable circuit is configured to generate a signal on the control output to prevent the clock signal from propagating from the clock input through the clock distribution circuit to the clock output.

BRIEF DESCRIPTION OF THE FIGURES

In the figures, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Terminology

In the following description, we refer to the voltages "VDD" and "VSS," which are the drain and source voltages, respectively, for metal-oxide-semiconductor (MOS) transistors in the described embodiments. As is known in the art, VDD is typically the positive system voltage (e.g., 1.1 V), while VSS is the negative system voltage or ground (e.g., 0 V). Note that although we describe embodiments where these designations apply, alternative embodiments can use different voltages or different designations.

In the following description, we refer to signals being "asserted" or "deasserted." When a signal is asserted, the signal is set to a logical "1" value. In some embodiments, the logical 1 is equivalent to VDD. For example, the logical 1 is a voltage of 1.2 V in a system where VDD is 1.2 V. When a signal is deasserted, the signal is set to a logical "0" value, which is typically VSS or 0 V. Note that, although we describe embodiments where signals are asserted and deasserted using the indicated voltages, alternative embodiments can use different voltages.

System

Figure 6:
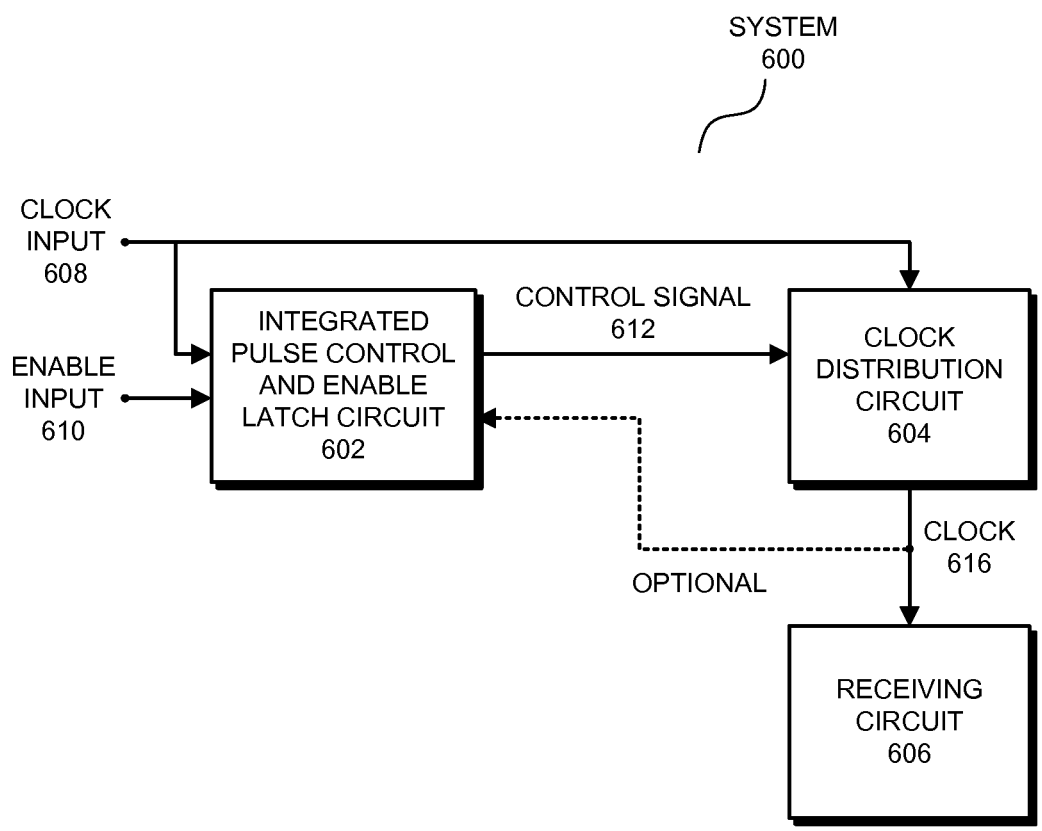
FIG. 6 presents a block diagram of a system in accordance with the described embodiments.

FIG. 6 presents a block diagram of a clock generation circuit 600 in accordance with the described embodiments. Clock generation circuit 600 includes integrated pulse-control and enable latch circuit 602 (interchangeably called "control and enable circuit"), clock distribution circuit 604, and receiving circuit 606. Integrated pulse-control and enable latch circuit 602 generates a control signal 612 that controls the waveform of a clock 616 output by clock distribution circuit 604. Receiving circuit 606 receives the clock 616 output by clock distribution circuit 604 and uses clock 616 as a timing or control signal.

Integrated pulse-control and enable latch circuit 602 can be any circuit that can be configured to generate a control signal to either: (1) enable a clock; or (2) control the pulse length of a pulsed clock.

When integrated pulse-control and enable latch circuit 602 is configured to generate a control signal to enable a clock, control signal 612 can be used to enable the full duty-cycle waveform of clock input 608 to pass through clock distribution circuit 604. For the purposes of describing the embodiments, we refer to the operating mode in which integrated pulse-control and enable latch circuit 602 generates the enable signal as the "clock mode." In the clock mode, integrated pulse-control and enable latch circuit 602 holds control signal 612 steady during one phase of clock input 608 to prevent control signal 612 from switching at an incorrect time and causing glitches in clock 616. For example, in some embodiments, during the high phase of clock input 608, integrated pulse-control and enable latch circuit 602 can hold control signal 612 steady in the asserted or deasserted state that was present as the rising transition occurred on clock input 608 at the beginning of the high phase. In these embodiments, control signal 612 only switches during the opposite phase of clock input 608 (e.g., the low phase of clock input 608).

In contrast, when configured to generate a control signal to control the pulse length of a pulsed clock, integrated pulse-control and enable latch circuit 602 generates a control signal that is the length of a pulse to be output on clock 616. For example, assuming that a pulse of N pS is to be output on clock 616, integrated pulse-control and enable latch circuit 602 can be configured to generate a rising pulse of N pS in control signal 612 that is then used to enable clock 616. For the purposes of describing the embodiments, we refer to the operating mode in which the pulse is generated as the "pulse mode."

Clock distribution circuit 604 can include one or more circuit elements or functional blocks that are configured to conditionally forward clock input 608 to output clock 616. The forwarding of clock input 608 through clock distribution circuit 604 is controlled by control signal 612. More specifically, during clock mode, the circuit elements or functional blocks in clock distribution circuit 604 are configured to forward an unmodified (i.e., full duty-cycle) version of clock 616 when control signal 612 is asserted, but to prevent clock input 608 from propagating to clock 616 when control signal 612 is deasserted. On the other hand, during pulse mode, the circuit elements or functional blocks are configured to forward a pulsed output signal on clock 616 as controlled by an asserted pulse on control signal 612, but otherwise to block propagation of clock input 608 through clock distribution circuit 604 when control signal 612 is deasserted.

In some embodiments, clock 616 feeds back to integrated pulse-control and enable latch circuit 602. As described below, in some embodiments, clock 616 can be used in generating control signal 612. Note, however, that although clock 616 is shown in FIG. 6 as feeding back to integrated pulse-control and enable latch circuit 602, in some embodiments, clock 616 does not feed back to integrated pulse-control and enable latch circuit 602 (i.e., the feedback of clock 616 is optional). For example, in embodiments where integrated pulse-control and enable latch circuit 602 is configured in the clock mode, clock 616 may not feed back to integrated pulse-control and enable latch circuit 602.

Receiving circuit 606 can be any type of circuit that uses the waveform generated by clock distribution circuit 604 as a timing signal, a control signal, a reference signal, a data signal, or for another purpose. For example, receiving circuit 606 can be, but is not limited to, one or more individual circuit elements (e.g., pulse latches, domino circuits, memory elements, control circuits, etc.), a synchronous random-access memory (SRAM) or dynamic random-access memory (DRAM), a microprocessor, a controller, or an application-specific integrated circuit (ASIC). In some embodiments, receiving circuit 606 uses a full duty-cycle clock 616. In alternative embodiments, receiving circuit 606 uses a pulsed clock 616. In other alternative embodiments, receiving circuit 606 can use either type of clock, depending on an operating mode (e.g., clock mode or pulse mode).

As described above, based on the state of clock input 608, enable input 610, and possibly clock 616, integrated pulse-control and enable latch circuit 602 generates an output signal on control signal 612. More specifically, in some embodiments, based on the state of enable input 610 and/or clock 616, integrated pulse-control and enable latch circuit 602 can be enabled and can generate either an enable or a pulse control signal. Alternatively, based on the state of enable input 610, integrated pulse-control and enable latch circuit 602 can be disabled and generate a steady, unchanging signal on control signal 612.

To disable integrated pulse-control and enable latch circuit 602, enable input 610 is deasserted. When integrated pulse-control and enable latch circuit 602 is disabled, control signal 612 is held steady in a deasserted state. Because control signal 612 is deasserted, clock distribution circuit 604 outputs a steady, unchanging waveform on clock 616. More specifically, in some embodiments, when control signal 612 is deasserted, clock distribution circuit 604 outputs clock 616 steadily at a predetermined voltage level (e.g., VDD or VSS). Note that integrated pulse-control and enable latch circuit 602 can be disabled by deasserting enable input 610, regardless of any signal waveform in clock input 608.

In contrast, to enable integrated pulse-control and enable latch circuit 602, enable input 610 is asserted. As described above, when enable input 610 is asserted, the waveform output by integrated pulse-control and enable latch circuit 602 on control signal 612 can be either an enable signal if integrated pulse-control and enable latch circuit 602 is configured in the clock mode, or can be a pulsed waveform if integrated pulse-control and enable latch circuit 602 is configured in the pulse mode.

In some embodiments, to configure integrated pulse-control and enable latch circuit 602 in the clock mode, the feedback from clock 616 is coupled to VSS. For these embodiments, the feedback from clock 616 shown in FIG. 6 is optional, as the feedback input to integrated pulse-control and enable latch circuit 602 can be locally coupled to VSS.

In some embodiments, to configure integrated pulse-control and enable latch circuit 602 in the pulse mode, the feedback from clock 616 is coupled to integrated pulse-control and enable latch circuit 602. In some embodiments, in this configuration, a rising pulse on control signal 612 starts at the rising edge of clock input 608. The rising pulse on control signal 612 enables clock distribution circuit 604 to forward the rising edge of clock input 608 to clock 616. The rising edge of the clock signal on clock 616 then feeds back to integrated pulse-control and enable latch circuit 602, causing a falling edge on control signal 612 and ending the rising pulse on control signal 612. The falling edge on control signal 612 disables clock distribution circuit 604, ending the rising pulse on control signal 612. (Note that, although we describe a rising pulse on control signal 612, alternative embodiments use a falling pulse on control signal 612).

Figure 1:
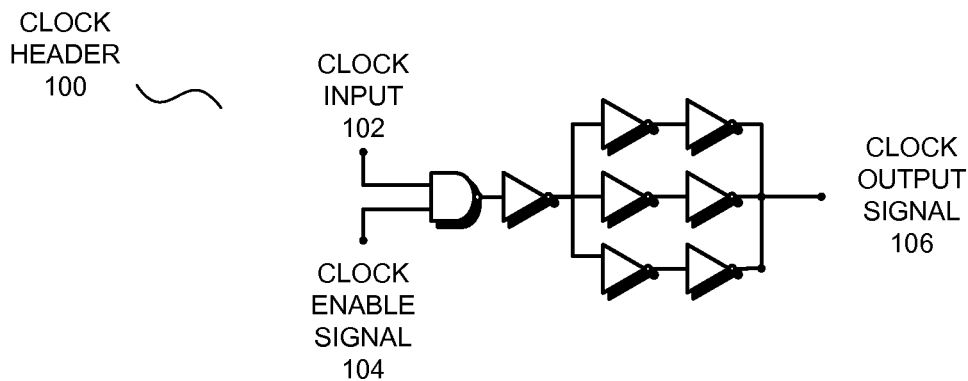
FIG. 1 presents an exemplary clock header used to distribute a clock signal in an integrated circuit.
Figure 2:
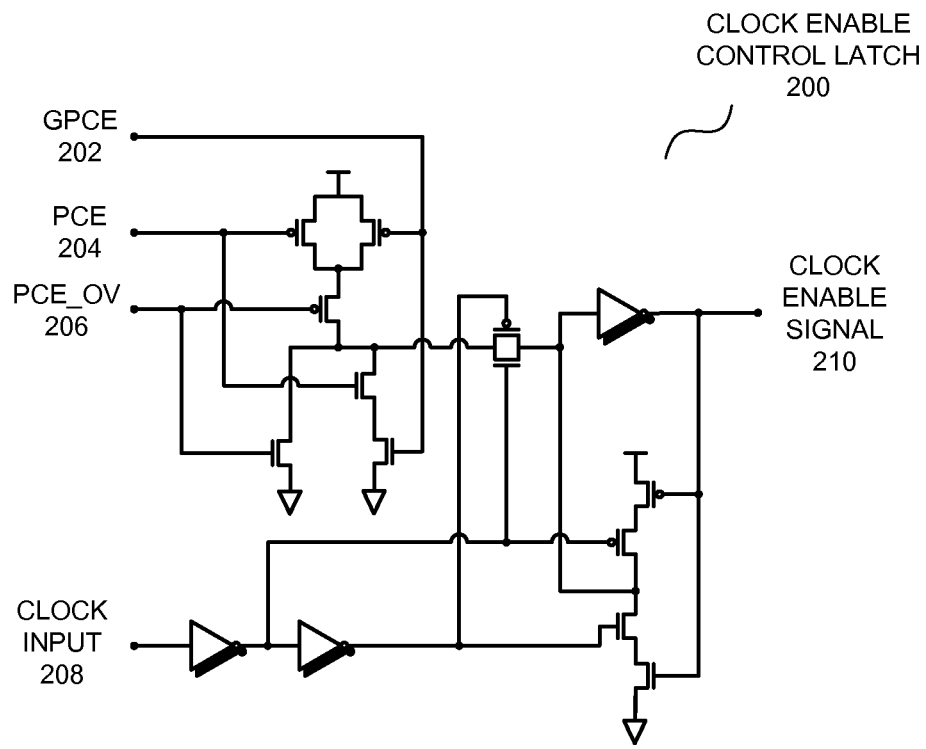
FIG. 2 presents an exemplary clock enable control latch.
Figure 3:
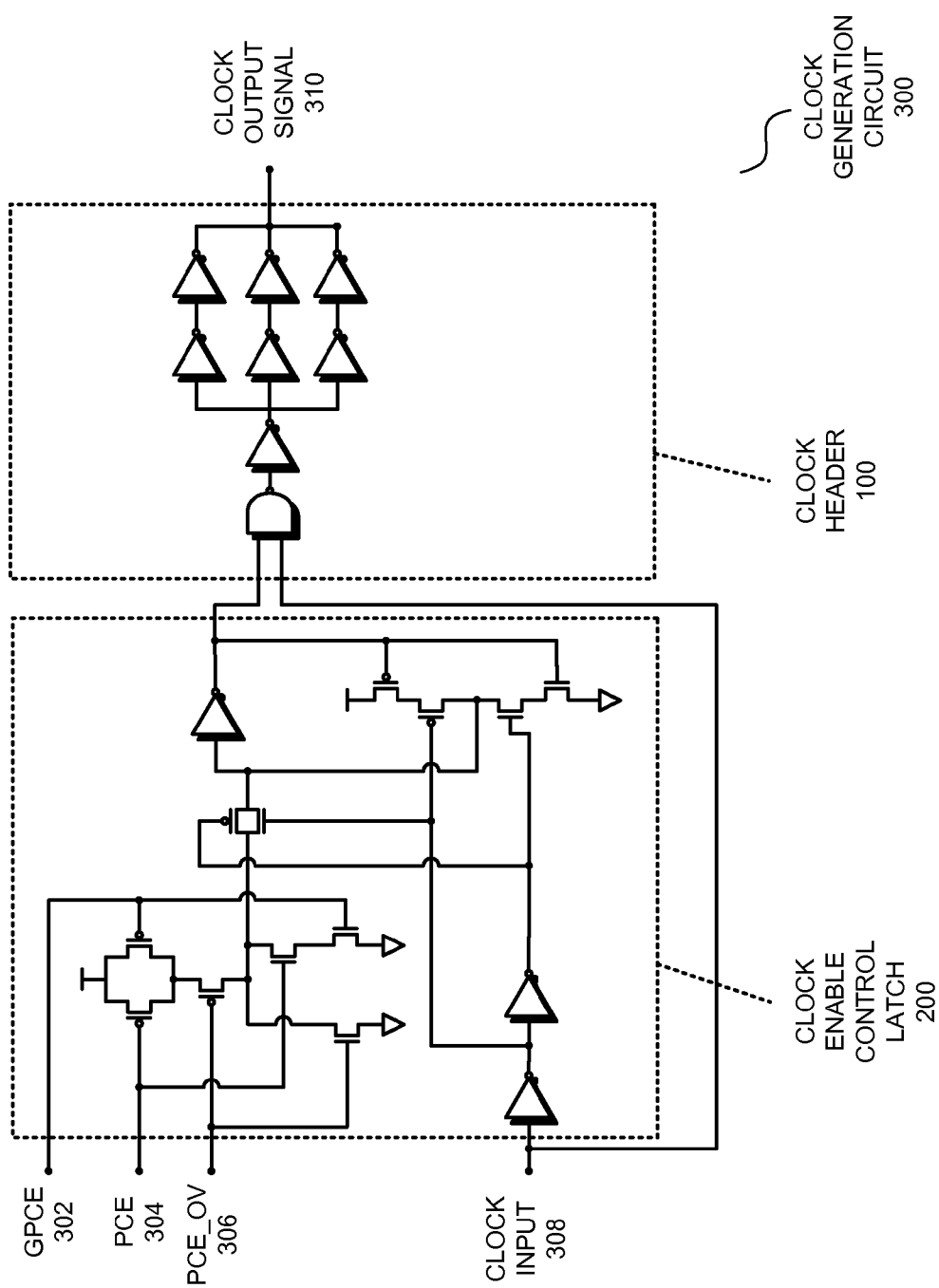
FIG. 3 presents an exemplary clock generation circuit.
Figure 4:
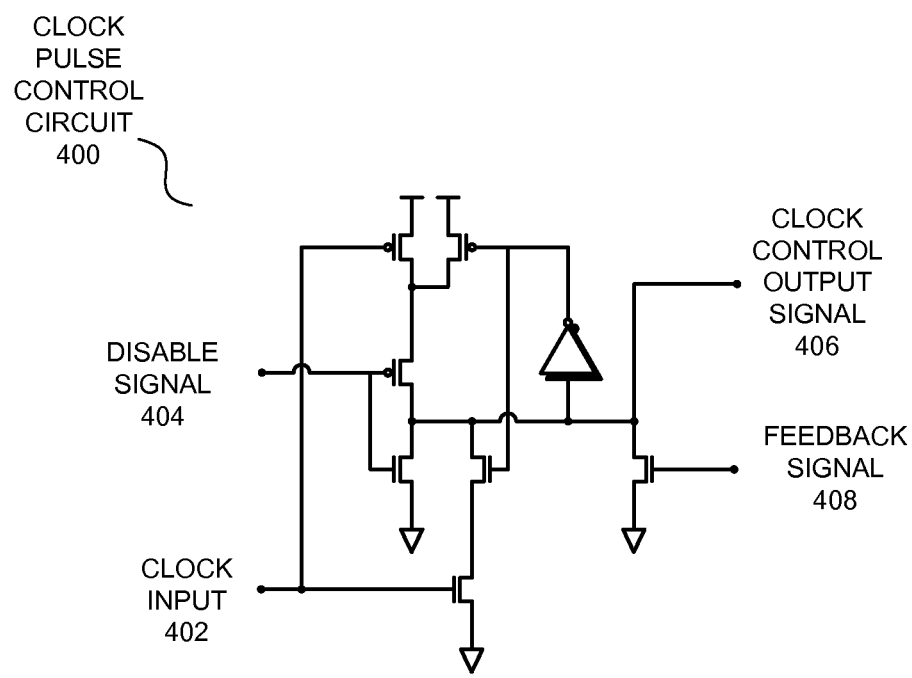
FIG. 4 presents an exemplary clock pulse control circuit.
Figure 5:
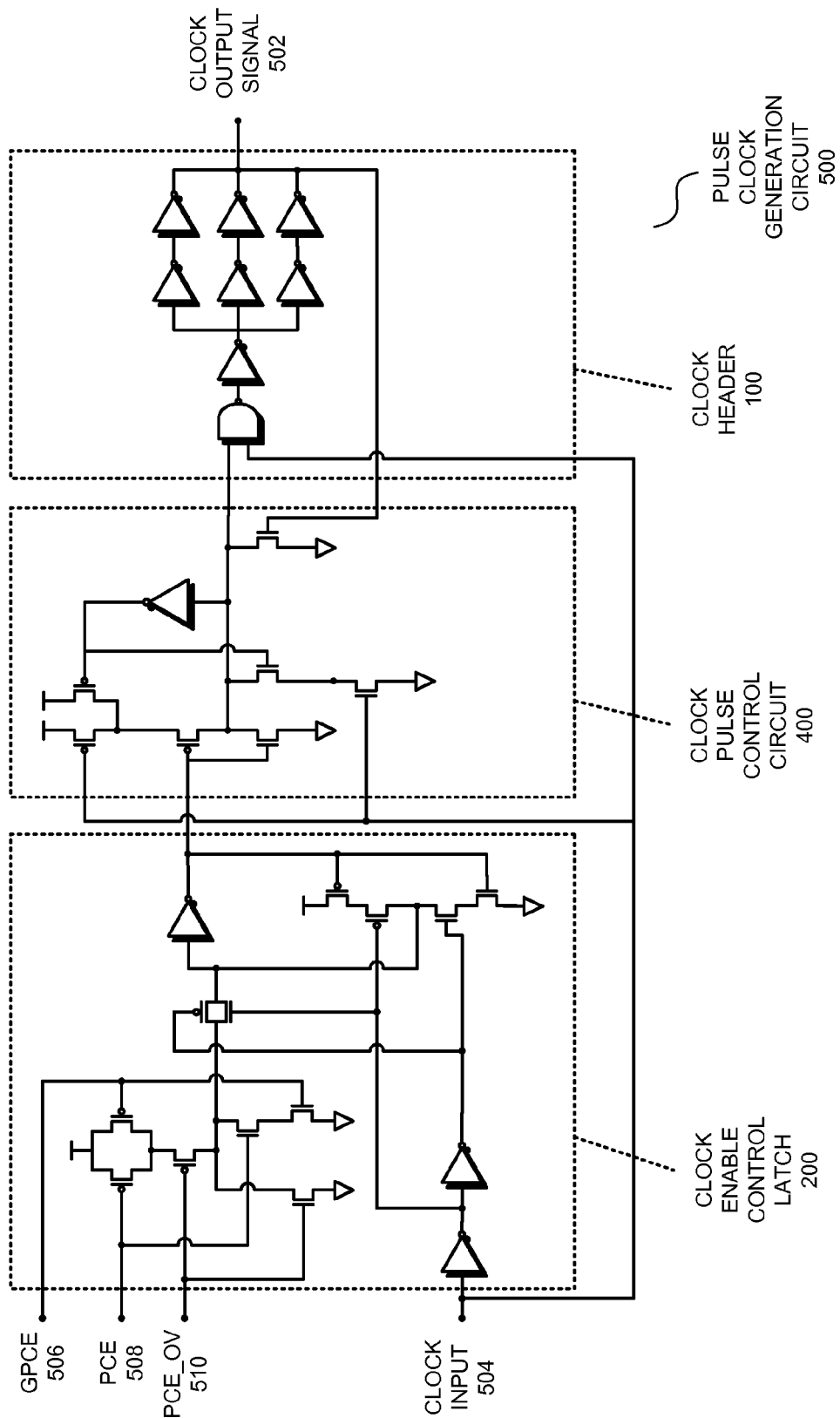
FIG. 5 presents an exemplary pulse clock generation circuit.

Note that, unlike the above-described existing clock enable circuit (shown in FIG. 3) and clock-control circuit (shown in FIG. 5), integrated pulse-control and enable latch circuit 602 does not require that enable input 610 be changed from one logical state to another (i.e., inverted) in order to generate each type of control signal. More specifically, in some embodiments, enable input 610 is an active-high signal that enables integrated pulse-control and enable latch circuit 602 to generate the indicated control signals. Because integrated pulse-control and enable latch circuit 602 can be operated in either clock mode or pulse mode with the same logical state for the enable signal, integrated pulse-control and enable latch circuit 602 can be substituted more easily in circuits to convert the circuits from a full duty-cycle clock to a pulsed clock. In addition, no extra devices (transistors, functional blocks, etc.) are required for the change from clock enabling to pulse clock control generation, because integrated pulse-control and enable latch circuit 602 can generate either type of waveform.

Clock generation circuit 600 can be incorporated into many different types of electronic devices. For example, clock generation circuit 600 can be part of a desktop computer, a laptop computer, a server, a media player, an appliance, a cellular phone, a piece of audio/visual equipment, a piece of testing equipment, a network appliance, a personal digital assistant (PDA), a hybrid device (i.e., a "smart phone") or another electronic device.

Although we use specific components to describe clock generation circuit 600, in alternative embodiments, different components may be present in clock generation circuit 600. For example, clock generation circuit 600 may include one or more additional receiving circuits 606. In addition, although we show the input signals to integrated pulse-control and enable latch circuit 602 as including a number of signals, in alternative embodiments, more or fewer signals can be used as inputs for integrated pulse-control and enable latch circuit 602. For example, enable input 610, which is shown in FIG. 6 as a single enable signal may include one or more additional different control signals.

Integrated Pulse-Control and Enable Latch Circuit

Figure 7:
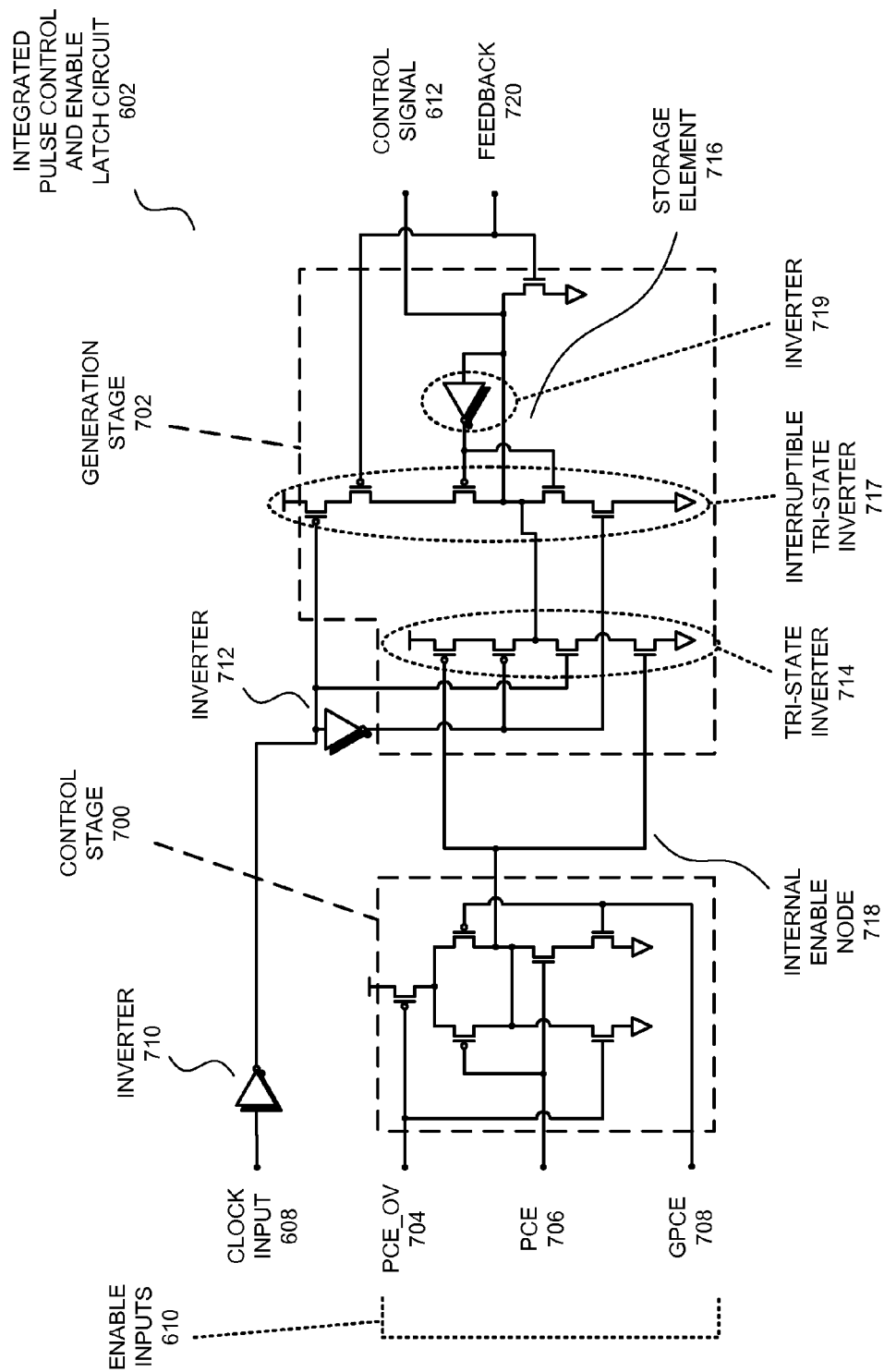
FIG. 7 presents a schematic view of an integrated pulse-control and enable latch circuit in accordance with the described embodiments.

FIG. 7 presents a schematic view of an integrated pulse-control and enable latch circuit 602 in accordance with the described embodiments. Integrated pulse-control and enable latch circuit 602 includes control stage 700 and generation stage 702. Control stage 700 logically combines enable inputs 610 to form an internal enable signal that either enables or disables generation stage 702. When enabled, depending on a signal on feedback 720, generation stage 702 generates either a clock enable or a pulsed control signal on control signal 612. When disabled, generation stage 702 outputs a steady signal (at VSS) on control signal 612. (Note that we interchangeably call integrated pulse-control and enable latch circuit 602 a "control and enable circuit.")

Note that, although we show an embodiment where the enable inputs 610 include power clock enable override (PCE_OV) 704, power clock enable (PCE) 706, and global power clock enable (GPCE) 708, alternative embodiments can use different numbers of enable signals and/or different combinational logic. For example, in some embodiments, enable inputs 610 include only a single enable signal that can be fed through an inverter to generation stage 702 (and not an and-or-invert (AOI) gate as shown in FIG. 7).

In the embodiment shown in FIG. 7, clock input 608 is coupled to inverters 710 and 712. The pair of inverters is configured to provide both a non-inverted and an inverted version of clock input 608 to generation stage 702. Note that in some embodiments only one inverter may used, as a single inverter is sufficient to provide the inverted version of clock input 608 to the internal circuit elements in integrated pulse-control and enable latch circuit 602, and the non-inverted version of clock input 608 exists as an input to integrated pulse-control and enable latch circuit 602. However, embodiments where two inverters are used can have improved clock slew rates and can be configured to place less load on clock input 608.

Within integrated pulse-control and enable latch circuit 602, tri-state inverter 714 is configured to selectively forward the enable signal on internal enable node 718 to the control signal 612 output. Tri-state inverter 714 includes an NMOS transistor and a PMOS transistor coupled to clock input 608 to disable tri-state inverter 714 so that tri-state inverter 714 is not driving when clock input 608 is in the high logical state (i.e., is a logical "1"), and to enable tri-state inverter 714 when clock input 608 is in the low logical state. Because tri-state inverter 714 is configured in this way, tri-state inverter 714 prevents changes in enable inputs 610 from propagating to control signal 612 when clock input 608 is in the high logical state, which can prevent glitches in a clock signal enabled by control signal 612 caused by mistimed transitions in enable inputs 610.

Storage element 716 is formed from a back-to-back inverter pair that includes interruptible tri-state inverter 717 and inverter 719. Interruptible tri-state inverter 717 includes an NMOS transistor and a PMOS transistor coupled to clock input 608 that enable the value stored in storage element 716 to be updated when clock input 608 transitions from high to low (i.e., a "write" of the storage element 716). The write of storage element 716 captures a value on internal enable node 718 driven by control stage 700. The captured value can then be held during the high phase of clock input 608. (Interruptible tri-state inverter 717 also includes an interrupt PMOS transistor, as is described below.)

Note that, although storage element 716 is able to hold the captured value on control signal 612 during the high phase of clock input 608, when integrated pulse-control and enable latch circuit 602 is configured in the pulse mode, a feedback clock signal can cause the NMOS transistor coupled to feedback 720 to pull control signal 612 to VSS to end the rising pulse on control signal 612, thereby changing the value held in storage element 716 before the end of the high phase on clock input 608.

As described above, tri-state inverter 714 is disabled as clock input 608 transitions from low to high, but is otherwise enabled. In addition, storage element 716 is written as clock input 608 transitions from high to low. This configuration of these circuit elements causes enable inputs 610 to propagate to control signal 612 unchanged (including any transitions) while clock input 608 is low, but captures the state of enable inputs 610 as clock input 608 transitions from low to high and holds the captured value in storage element 716 for the duration of the high on clock input 608. In other words, integrated pulse-control and enable latch circuit 602 is transparent to changes in enable inputs 610 during the low phase of clock input 608.

In some embodiments, feedback 720 is coupled to a clock signal from a clock distribution circuit (e.g., clock 616 from clock distribution circuit 604). This configuration places integrated pulse-control and enable latch circuit 602 in the pulse mode so that integrated pulse-control and enable latch circuit 602 generates pulses on control signal 612 to control a pulsed clock. More specifically, the PMOS transistor coupled to feedback 720 in interruptible tri-state inverter 717, in combination with the NMOS transistor coupled to feedback 720, enables a clock feedback from the clock distribution circuit (e.g., a rising edge of clock 616 from clock distribution circuit 604) to propagate back to integrated pulse-control and enable latch circuit 602 to end the rising pulse on control signal 612 generated from a rising edge of clock input 608. Note that the PMOS device coupled to feedback 720 in interruptible tri-state inverter 717 prevents contention while the NMOS transistor coupled to feedback 720 is pulling the control signal 612 node low to end the rising pulse on control signal 612.

In some embodiments, feedback 720 is coupled to VSS. This configuration places integrated pulse-control and enable latch circuit 602 in the clock mode so that integrated pulse-control and enable latch circuit 602 generates a clock enable signal. In these embodiments, the PMOS transistor coupled to feedback 720 in interruptible tri-state inverter 717 is always enabled, and the NMOS transistor coupled to feedback 720 is always disabled. Hence, these embodiments generate a clock enable signal that is not terminated by the return of a feedback from clock distribution circuit 604. In other words, instead of generating a pulsed control signal 612, these embodiments forward enable inputs 610 to form a clock enable on control signal 612. In these embodiments, transitions on enable inputs 610 are only forwarded to control signal 612 during the low phase of clock input 608, as described above.

Figure 8:
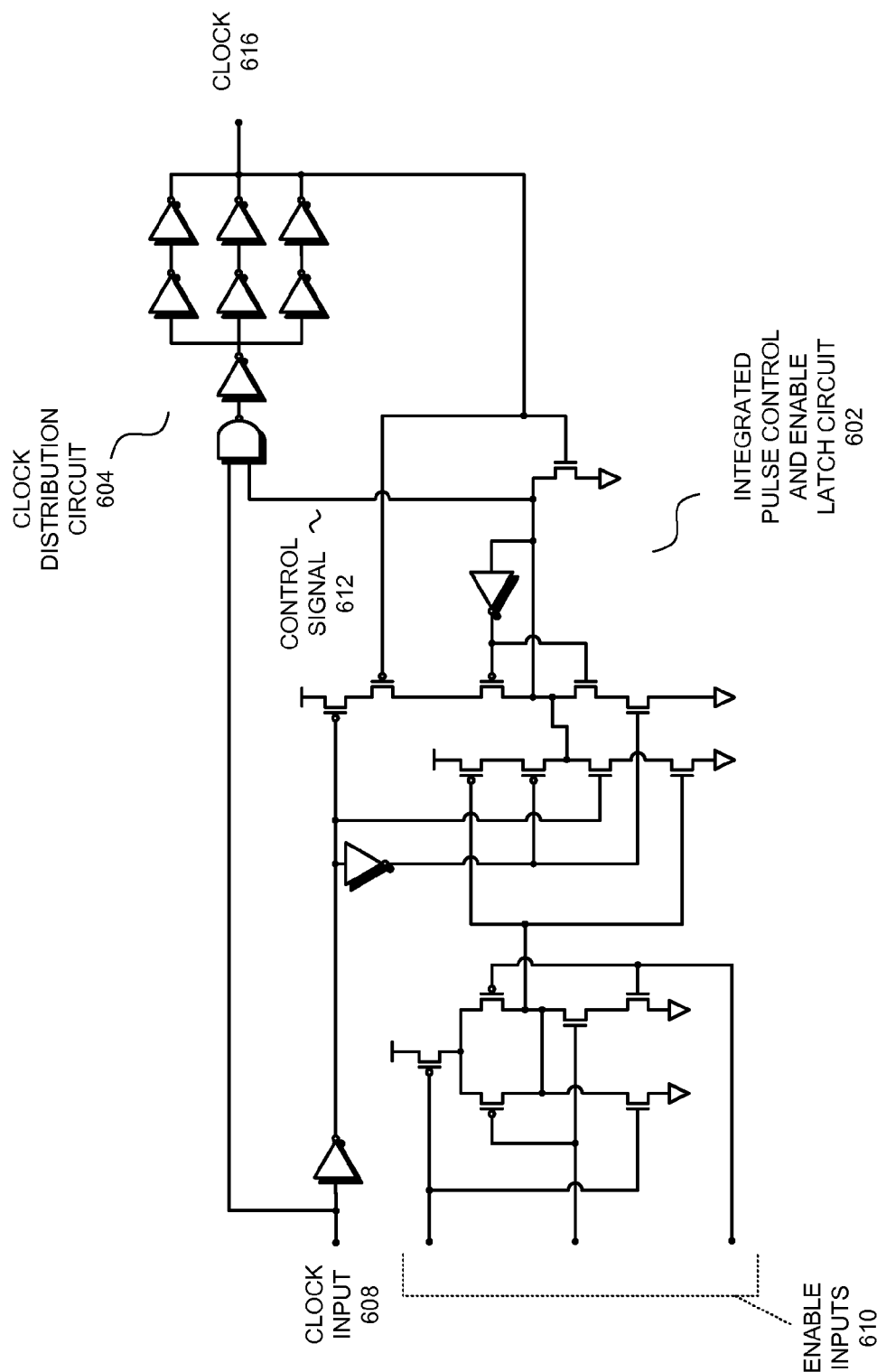
FIG. 8 presents a schematic view of an integrated pulse-control and enable latch circuit coupled to a clock distribution circuit in accordance with the described embodiments.

FIG. 8 presents a schematic view of an integrated pulse-control and enable latch circuit 602 coupled to a clock distribution circuit 604 in accordance with the described embodiments. The circuit shown in FIG. 8 is configured to generate a pulsed clock; hence, clock 616 is fed back into integrated pulse-control and enable latch circuit 602.

Figure 9:
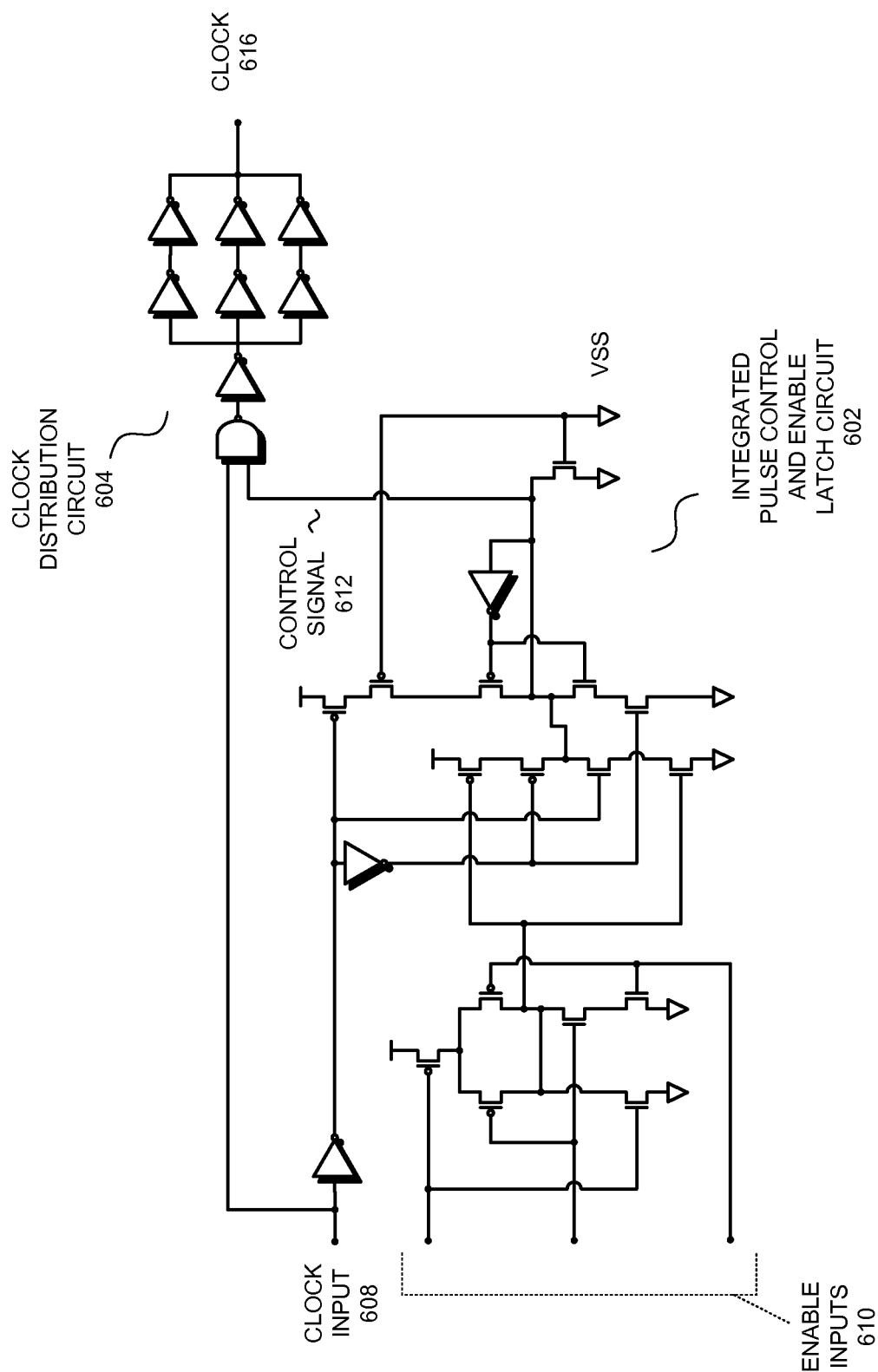
FIG. 9 presents a schematic view of an integrated pulse-control and enable latch circuit coupled to a clock distribution circuit in accordance with the described embodiments.

FIG. 9 presents a schematic view of an integrated pulse-control and enable latch circuit 602 in accordance with the described embodiments. The circuit shown in FIG. 9 is configured to generate a clock enable (i.e., to enable the full duty-cycle of clock input 608 to propagate to clock 616); hence, the gate connections of the PMOS and NMOS transistor used as a feedback path in the other configuration are coupled to ground (VSS) in this configuration.

Comparing FIGS. 8-9, it can be seen that the integrated pulse-control and enable latch circuit 602 can be configured as either a clock enable latch or a pulse control by simply switching a gate connection of the feedback MOS transistors from being coupled to clock 616 to being coupled to ground (VSS). Because this configuration requires almost no change in the layout of the circuit (i.e., no logical changes are required in the enable signals, no extra devices are required, etc.), integrated pulse-control and enable latch circuit 602 can be used more easily than existing circuits in applications where a clock enable may be switched to a pulse control (i.e., when switching from a full duty-cycle clock to a pulsed clock).

Process for Using an Integrated Pulse-Control and Enable Latch Circuit

Figure 10:
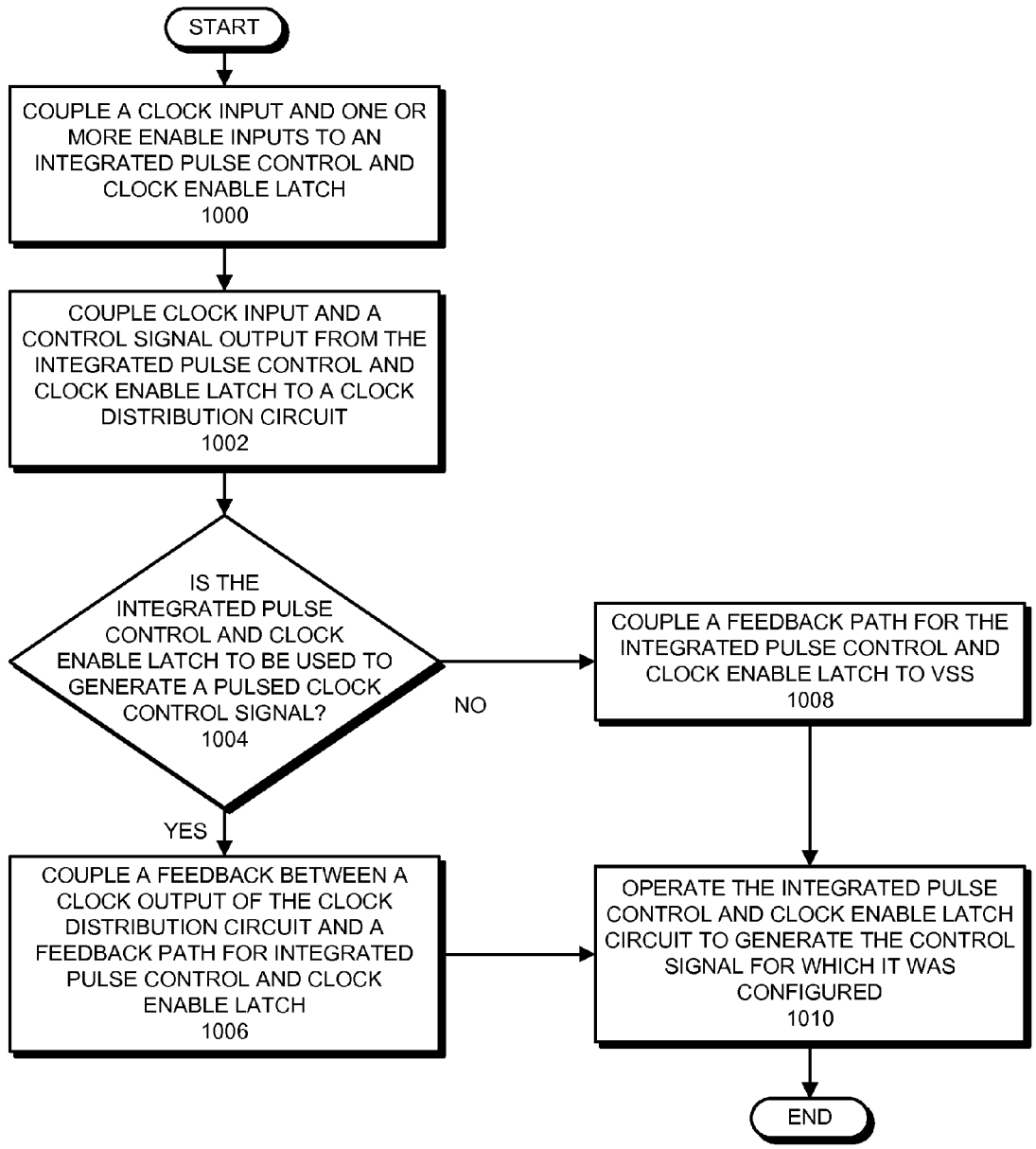
FIG. 10 presents a flowchart illustrating a process for using an integrated pulse-control and enable latch circuit in accordance with the described embodiments.

FIG. 10 presents a flowchart illustrating a process for using an integrated pulse-control and enable latch circuit 602 in accordance with the described embodiments. The process starts by coupling a clock input 608 and one or more enable inputs 610 to an integrated pulse-control and enable latch circuit 602 (step 1000). Clock input 608 and a control signal 612 of integrated pulse-control and enable latch circuit 602 are then coupled to the inputs of a clock distribution circuit 604 (step 1002).

Next, if integrated pulse-control and enable latch circuit 602 is to be used to generate a pulsed clock control signal 612 (step 1004), a feedback is coupled between a clock output of clock distribution circuit 604 and a feedback path for integrated pulse-control and enable latch circuit 602 (step 1006). Otherwise, the feedback input for integrated pulse-control and enable latch circuit 602 is coupled to VSS (step 1008).

Integrated pulse-control and enable latch circuit 602 is then operated to generate the control signal 612 for which integrated pulse-control and enable latch circuit 602 was configured (step 1010). More specifically, if integrated pulse-control and enable latch circuit 602 is configured to enable a pulsed clock signal, integrated pulse-control and enable latch circuit 602 generates rising pulses on control signal 612, the lengths of which are controlled by the feedback path from clock 616 (as described above). Otherwise, if integrated pulse-control and enable latch circuit 602 is configured to generate a clock enable signal, integrated pulse-control and enable latch circuit 602 generates an enable signal on control signal 612. In both cases, the configuration of tri-state inverter 714 and storage element 716 prevents an incorrect transition on control signal 612 caused by a mistimed transition in the one or more enable signals.

Alternative Embodiments

Figure 11:
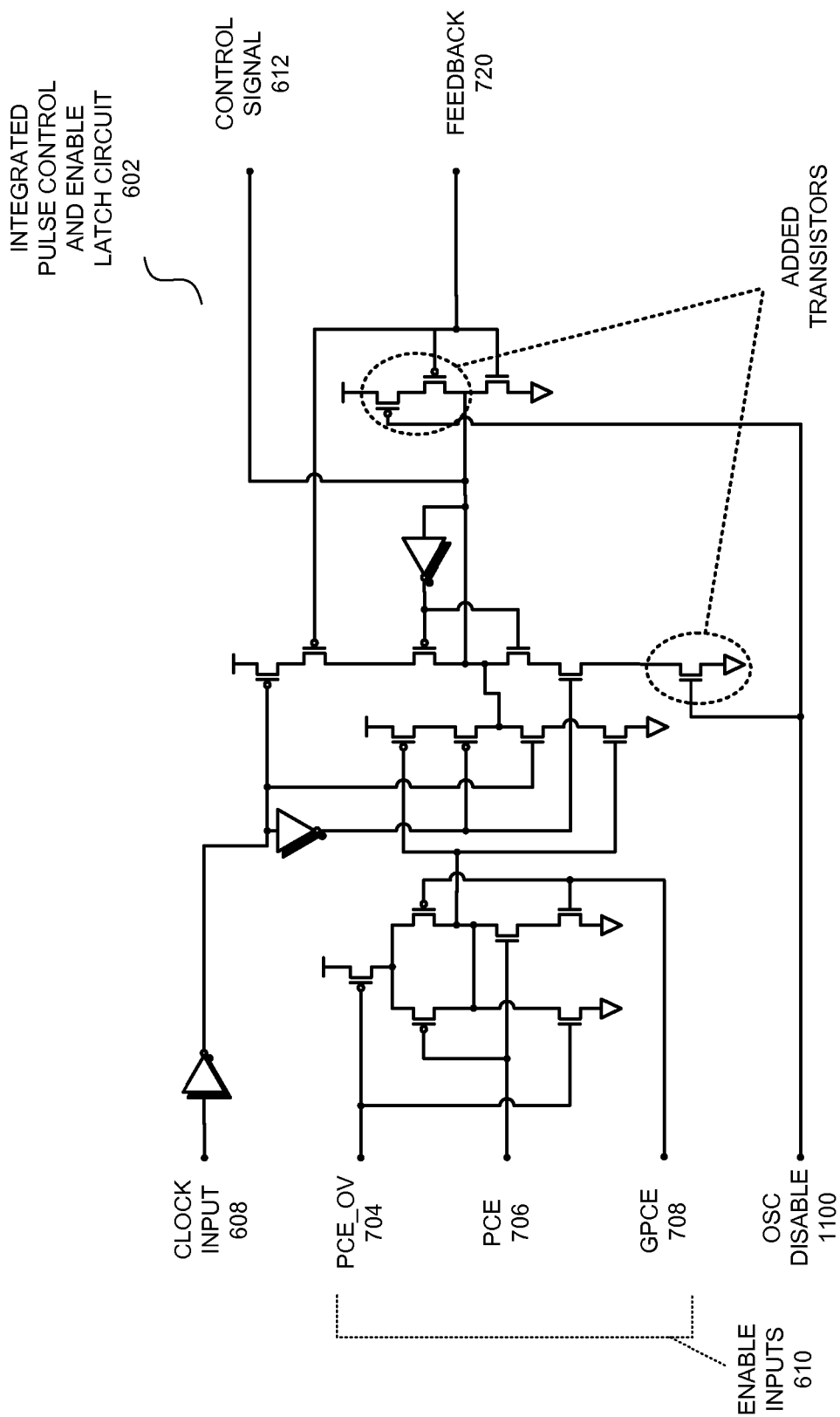
FIG. 11 presents an alternative embodiment of an integrated pulse-control and enable latch circuit.

FIG. 11 presents an alternative embodiment of integrated pulse-control and enable latch circuit 602. In the embodiment shown in FIG. 11, three transistors have been added to integrated pulse-control and enable latch circuit 602 to enable the configuration of integrated pulse-control and enable latch circuit 602 as a ring oscillator. When integrated pulse-control and enable latch circuit 602 is configured as a ring oscillator, the frequency of the oscillating waveform output from integrated pulse-control and enable latch circuit 602 can be measured and used to determine the pulse length of the pulse output from integrated pulse-control and enable latch circuit 602 (i.e., in pulse mode).

The additional transistors include an NMOS transistor added to the interruptible tri-state inverter in the storage element, and two series-coupled PMOS transistors added to the control signal 612 node. The additional transistors enable integrated pulse-control and enable latch circuit 602 to be configured using oscillator disable (OSC DISABLE) 1100 to include an additional complete inversion formed by the NMOS transistor and the additional PMOS transistor coupled to feedback 720 to switch integrated pulse-control and enable latch circuit 602 from a pulse generator (i.e., in the pulse mode) to an oscillator.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A configurable clock circuit operable to receive a clock signal, comprising:
 a control and enable circuit having a clock input, a feedback input, and a control output, the clock input configured to receive the clock signal; and
 a clock distribution circuit coupled to the clock input configured to receive the clock signal and having an enable input and a clock output, the enable input coupled to the control output of the control and enable circuit;
 wherein when the feedback input is configured in a clock mode, the feedback input is coupled to VSS, and the control and enable circuit generates a control signal on the control output to enable the clock signal to propagate through the clock distribution circuit to the clock output, and wherein, when the feedback input is configured in the clock mode, enabling the clock signal to propagate through the clock distribution circuit to the clock output comprises using the feedback input to enable at least one full duty-cycle waveform for the clock input to propagate through the clock distribution circuit to the clock output;
 wherein when the feedback input is configured in a pulse mode, the feedback input is coupled to the clock output, and the control and enable circuit generates a control signal on the control output to control a length of a pulse responsive to the clock signal at the clock output of the clock distribution circuit; and
 wherein the feedback input is coupled to an input of an interruptible tri-state inverter and to a transistor, wherein the interruptible tri-state inverter has a second input coupled to an inverted version of the clock input, a third input coupled to a non-inverted version of the clock input, and an output coupled to the transistor.

2. The circuit of claim 1, wherein the control and enable circuit further comprises:
 a tri-state inverter having an input coupled to the non-inverted version of the clock input, an input coupled to the inverted version of the clock input, an input coupled to an internal enable node, and an output coupled to the control output;
 wherein the tri-state inverter is configured to propagate the signal on the internal enable node through the tri-state inverter to the control output when the clock signal is low, and to not propagate the signal on the internal enable node through the tri-state inverter when the clock signal is high.

3. The circuit of claim 2, wherein the tri-state inverter includes two p-type metal-oxide-semiconductor (PMOS) transistors coupled in series between VDD and the control output and two n-type metal-oxide-semiconductor (NMOS) transistors coupled in series between VSS and the control output;
 wherein a gate connection for both a first of the NMOS transistors and a first of the PMOS transistors is coupled to the internal enable node;
 wherein a gate connection for a second of the PMOS transistors is coupled to the non-inverted version of the clock input; and
 wherein a gate connection for a second of the NMOS transistors is coupled to the inverted version of the clock input.

4. The circuit of claim 2, wherein the control and enable circuit further comprises:
 a storage element coupled to the control output, wherein the storage element comprises:
 an interruptible tri-state inverter that includes an input coupled to the non-inverted version of the clock input, an input coupled to the inverted version of the clock input, an input coupled to an internal memory node, an input coupled to the feedback input, and an output coupled to the control output; and
 an inverter that includes an input coupled to the control output and an output coupled to the internal memory node;
 wherein the interruptible tri-state inverter is configured to enable the storage element to capture a value on the control output when the clock signal transitions from low to high and store the value while the clock signal is high.

5. The circuit of claim 4, wherein the interruptible tri-state inverter includes three PMOS transistors coupled in series between VDD and the control output and two NMOS transistors coupled in series between VSS and the control output;
 wherein a gate connection for a first of the NMOS transistors is coupled to the non-inverted version of the clock input;
 wherein a gate connection for a first of the PMOS transistors is coupled to the inverted version of the clock input;
 wherein a gate connection for a second of the PMOS transistors is coupled to the feedback input; and
 wherein a gate connection for a third of the PMOS transistors and a second of the NMOS transistors is coupled to the internal memory node.

6. The circuit of claim 4, wherein the control and enable circuit further comprises:
 an NMOS transistor coupled between the control output and VSS, wherein a gate connection of the NMOS transistor is coupled to the feedback input.

7. The circuit of claim 2, wherein the control and enable circuit includes:
 at least one external enable input configured to receive at least one external enable signal; and
 a control stage having an inverting circuit element coupled between the at least one external enable input and the internal enable node configured to propagate the at least one external enable signal to the tri-state inverter.

8. The circuit of claim 7, wherein when a signal on the at least one external enable input is asserted, the control and enable circuit is configured to generate a signal on the control output to control the clock signal in the clock distribution circuit in the clock mode or in the pulse mode; and wherein when a signal on the at least one external enable input is deasserted, the control and enable circuit is configured to generate a signal on the control output to prevent the clock signal from propagating from the clock input through the clock distribution circuit to the clock output.

9. An electronic device, comprising:

a control and enable circuit having a clock input, a feedback input, and a control output, the clock input configured receive a clock signal;

a clock distribution circuit coupled to the clock input configured to receive the clock signal and having an enable input and a clock output, the enable input coupled to the control output of the control and enable circuit; and a receiving circuit having a clock input, wherein the receiving circuit is configured to receive a signal on the clock output from the clock distribution circuit on the clock wherein when the feedback input is configured in a clock mode, the feedback input is coupled to VSS, and the control and enable circuit generates a control signal on the control output to enable the clock signal to propagate through the clock distribution circuit to the clock output, and wherein, when the feedback input is configured in the clock mode, enabling the clock signal to propagate through the clock distribution circuit to the clock output comprises using the feedback input to enable at least one full duty-cycle waveform for the clock input to propagate through the clock distribution circuit to the clock output;

wherein when the feedback input is configured in a pulse mode, the feedback input is coupled to the clock output, and the control and enable circuit generates a control signal on the control output to control a length of a pulse responsive to the clock signal at the clock output of the clock distribution circuit; and wherein the feedback input is coupled to an input of an interruptible tri-state inverter and to a transistor, wherein the interruptible tri-state inverter has a second input coupled to an inverted version of the clock input, a third input coupled to a non-inverted version of the clock input, and an output coupled to the transistor.

10. The electronic device of claim 9, wherein the control and enable circuit further comprises:

a tri-state inverter having an input coupled to the non-inverted version of the clock input, an input coupled to the inverted version of the clock input, an input coupled to an internal enable node, and an output coupled to the control output;

wherein the tri-state inverter is configured to propagate the signal on the internal enable node through the tri-state inverter to the control output when the clock signal is low, and to not propagate the signal on the internal enable node through the tri-state inverter when the clock signal is high.

11. The electronic device of claim 10, wherein the tri-state inverter includes two p-type metal-oxide-semiconductor (PMOS) transistors coupled in series between VDD and the control output and two n-type metal-oxide-semiconductor (NMOS) transistors coupled in series between VSS and the control output;

wherein a gate connection for both a first of the NMOS transistors and a first of the PMOS transistors is coupled to the internal enable node;

wherein a gate connection for a second of the PMOS transistors is coupled to the non-inverted version of the clock input; and wherein a gate connection for a second of the NMOS transistors is coupled to the inverted version of the clock input.

12. The electronic device of claim 10, wherein the control and enable circuit comprises:

a storage element coupled to the control output, wherein the storage element comprises:

an interruptible tri-state inverter that includes an input coupled to the non-inverted version of the clock input, an input coupled to the inverted version of the clock input, an input coupled to an internal memory node, an input coupled to the feedback input, and an output coupled to the control output; and an inverter that includes an input coupled to the control output and an output coupled to the internal memory node;

wherein the interruptible tri-state inverter is configured to enable the storage element to capture a value on the control output when the clock signal transitions from low to high and store the value while the clock signal is high.

13. The electronic device of claim 12, wherein the interruptible tri-state inverter includes three PMOS transistors coupled in series between VDD and the control output and two NMOS transistors coupled in series between VSS and the control output;

wherein a gate connection for a first of the NMOS transistors is coupled to the non-inverted version of the clock input;

wherein a gate connection for a first of the PMOS transistors is coupled to the inverted version of the clock input;

wherein a gate connection for a second of the PMOS transistors is coupled to the feedback input; and wherein a gate connection for a third of the PMOS transistors and a second of the NMOS transistors is coupled to the internal memory node.

14. The electronic device of claim 12, wherein the control and enable circuit further comprises:

an NMOS transistor coupled between the control output and VSS, wherein a gate connection of the NMOS transistor is coupled to the feedback input.

15. The electronic device of claim 10, wherein the control and enable circuit includes a control stage having an inverting circuit element configured to receive at least one external enable input, the control stage having an enable output coupled to the internal enable node configured to enable the clock output of the clock distribution circuit in response to the at least one external enable input.

16. The electronic device of claim 15, wherein when a signal on the at least one external enable input is asserted, the control and enable circuit is configured to generate a signal on the control output to control the clock signal in the clock distribution circuit in the clock mode or in the pulse mode; and wherein when a signal on the at least one external enable input is deasserted, the control and enable circuit is configured to generate a signal on the control output to prevent the clock signal from propagating from the clock input through the clock distribution circuit to the clock output.

17. A method for operating a clock control circuit, comprising:
receiving a clock signal at a clock input of a clock distribution circuit, the clock distribution circuit having a clock control input and a clock output,
receiving the clock signal at a clock input of a clock control and enable circuit, the clock control and enable circuit having a control output coupled to the clock control input of the clock distribution circuit;
enabling a clock mode signal at the control output of the control and enable circuit to configure the clock distribution circuit to propagate the clock signal to the clock output by receiving VSS at a feedback input to the control and enable circuit, and wherein, configuring the clock distribution circuit to propagate the clock signal comprises using the feedback input to enable at least one full duty-cycle waveform for the clock input to propagate through the clock distribution circuit to the clock output; and
enabling a pulse mode signal at the control output of the control and enable circuit to configure the clock distribution circuit to generate a pulsed clock output responsive to the clock signal received at the clock input by receiving the clock output signal at a feedback input of the clock control and enable circuit,
wherein the feedback input is coupled to an input of an interruptible tri-state inverter and to a transistor, wherein the interruptible tri-state inverter has a second input coupled to an inverted version of the clock input, a third input coupled to a non-inverted version of the clock input, and an output coupled to the second transistor.

18. The circuit of claim 2, wherein the interruptible tri-state inverter has a transistor coupled to the input of the interruptible tri-state inverter, wherein controlling the length of the pulse comprises using the feedback input and the two transistors to end a rising pulse on the control output that was generated from a rising edge of the clock input, and wherein the transistor for the interruptible tri-state inverter prevents contention and the transistor pulls the control output low.

19. The circuit of claim 18, wherein the interruptible tri-state inverter has a fourth input coupled to the output of the interruptible tri-state inverter through an inverter.

20. The circuit of claim 19, wherein the feedback input is coupled to a gate terminal for the transistor and wherein the output coupled to the transistor is coupled a different terminal for the transistor.

21. The circuit of claim 20, wherein the output for the tri-state inverter is coupled to the output for the interruptible tri-state inverter.

* * * * *